United States Patent
Schunk et al.

(10) Patent No.: US 6,790,322 B2
(45) Date of Patent: Sep. 14, 2004

(54) PRODUCTION OF MATERIAL LIBRARIES USING SPUTTER METHODS

(75) Inventors: Stephan A. Schunk, Heidelberg (DE); Dirk Demuth, Mannheim (DE); Hartmut Hibst, Schriesheim (DE)

(73) Assignee: hte Aktiengesellschaft the high throughput experimentation company, Heidelberg (DE)

( * ) Notice: Subject to any disclaimer, the term of this patent is extended or adjusted under 35 U.S.C. 154(b) by 0 days.

(21) Appl. No.: 10/149,753

(22) PCT Filed: Dec. 12, 2000

(86) PCT No.: PCT/EP00/12600
§ 371 (c)(1),
(2), (4) Date: Nov. 13, 2002

(87) PCT Pub. No.: WO01/43865
PCT Pub. Date: Jun. 21, 2001

(65) Prior Publication Data
US 2003/0121771 A1 Jul. 3, 2003

(30) Foreign Application Priority Data
Dec. 13, 1999 (DE) ......................................... 199 59 972

(51) Int. Cl.[7] .............................................. C23C 14/34
(52) U.S. Cl. ............................ 204/192.13; 204/192.12; 204/192.15
(58) Field of Search ....................... 204/192.12, 192.15, 204/192.13; 43/866

(56) References Cited

U.S. PATENT DOCUMENTS

| | | | |
|---|---|---|---|
| 4,591,417 A | 5/1986 | Kaiser et al. | 204/192 R |
| 4,814,056 A | 3/1989 | Welty | 204/298 |
| 5,460,853 A | 10/1995 | Hintz et al. | 427/255.5 |

FOREIGN PATENT DOCUMENTS

| | | | | |
|---|---|---|---|---|
| WO | WO 98 47613 A | 10/1998 | | B01J/19/00 |
| WO | WO 99 19066 A | 4/1999 | | B01J/35/02 |

OTHER PUBLICATIONS

Van Dover et al., "Discovery of a Useful Thin–Film Dielectric Using a Composition–Spread Approach," *Nature* (Mar. 1998) 392:162–164, XP002166598.

Hanak, "The Multiple–Sample Concept in Materials Research: Synthesis, Compositional Analysis and Testing of Entire Multicomponent Systems," *Journal of Materials Science* (1970) 5:964–971, XP000908955, Chapman and Hall Ltd., Great Britain.

*Primary Examiner*—Steven VerSteeg
(74) *Attorney, Agent, or Firm*—Jones Day

(57) ABSTRACT

In a process for the combinatorial production of a library of materials in the form of a two-dimensional matrix in the surface region of a planar substrate by sputtering, the planar target used for the sputtering is arranged in parallel to the planar substrate and has surface regions of different chemical composition.

30 Claims, No Drawings

PRODUCTION OF MATERIAL LIBRARIES USING SPUTTER METHODS

The invention relates to processes for the combinatorial production of a library of materials in the surface region of a planar substrate by sputtering.

The parallelized production and testing of materials having suitable physical and/or chemical properties is a sector in material research which is currently greatly increasing in importance.

WO 98/47613 discloses a number of processes by which, using sputtering, CVD or PVD techniques, libraries of materials of potential interest can be generated. Basically, this application relates to the use of suitable masking techniques which makes possible defined deposition of at least two components (which are present as separate substrates) on one substrate, as a result of which composite materials are obtained. In addition, by means of the process, by generating gradients on the sputtered substrate, complete libraries of materials of differing composition can be generated.

The use of numerous different masks, which need to be positioned exactly to obtain reliable results, makes the process described complex to carry out.

It is an object of the present invention to provide a process for the combinatorial production of a library of materials, which process avoids the disadvantages of the known process.

We have found that this object is achieved by a process for the combinatorial production of a library of materials in the form of a two-dimensional matrix in the surface region of a planar substrate by sputtering, with the planar target used for the sputtering being arranged in parallel to the planar substrate and having surface regions of different chemical composition (e.g. a mosaic target).

In addition, the object is achieved according to the invention by a process for the combinatorial production of a library of materials in the surface region of a planar substrate by sputtering, with a ribbon-shaped substrate being shifted in the longitudinal direction and at least two targets of different chemical compositions which are used for the sputtering being arranged over the ribbon along the direction of shifting.

In the present invention the use of masks for generating the desired libraries is avoided, so that producing libraries is considerably simplified.

The fundamental idea of the mosaic target is that a materially inhomogeneous target for sputtering is used for the sputtering process, with a matrix of unknown composition being first produced by the sputtering process. Not until after successful testing for the desired physical or chemical property is the composition analyzed of the materials complying with the requirements. By coating the basic target with various other components, a gradient of the different components is produced on the sputtered matrix during the sputtering process. This gradient can be useful for producing alloys of metals and/or nonmetals, mixed oxides of metals and/or nonmetals or other classes of compounds of different compositions, provided that they are accessible by means of sputtering processes. By a suitable spatial arrangement of the components on the basic target, the sputtered matrix can be divided into sectors in which, in the manner of set theory, enrichment in each case of one of the components occurs, so that as great a range as possible of the potentially producible component mixtures can be generated.

Sputtering is the atomization of a solid surface by bombardment with high-energy ions such as $O^+$ or $Ar^+$ or neutral particles (FAB, fast atom beam bombardment). In sputtering, the kinetic energy of the primary particle, that is of the ions or neutral particles, is distributed by impact to the atoms of the solid (target). If in this process sufficient energy is transferred to a surface atom to overcome the surface binding energy, this can leave the solid as a free particle and be deposited on a substrate. In this manner, individual atoms, ions and clusters can be generated and deposited on substrates. The kinetic energy of the ions or neutral particles is generally from 0.1 to 20 keV. Suitable sputtering processes are known. Since the particles released have higher energies than thermally vaporized particles, they can be used for depositing thin layers on substrates, compared with what are termed PVD processes (Physical Vapor Deposition processes).

By selecting a target having surface regions of different composition, composition gradients of the material resulting on a substrate can be produced. Gradients of this type can also be achieved according to the invention by the material substrate being shifted spatially along a number of targets, the targets being excited in a phase-shifted manner.

Hitherto, sputtering processes have been used to generate compositions which are as homogeneous as possible, and not for generating gradients, cf. Ullmanns Encyclopedia of Industrial Chemistry, 6th Edition, 1998 Electronic Release, Wiley-VCH, Weinheim, Germany.

The term "library of materials" means that a multiplicity of materials of different composition are generated on a substrate. Preferably, at least 10, particularly preferably at least 100, different materials are formed on the substrate.

The expression "in the surface region" means that the materials are formed, for example, on a planar substrate, with the sputtered metals or nonmetals not penetrating into the substrate. This is the case, in particular, in the case of smooth ceramic, glass, plastic, metal, or carbon substrates. However, corresponding porous support materials can also be used, with the sputtered metals or nonmetals penetrating at least into the surface pores. In this case, according to the invention the material is formed in the topmost layer of the planar substrate, that is to say in the surface region.

The expression "planar substrate" means a substrate which extends considerably further in two directions in space than in the third direction in space. The planar substrate need not be flat, it can, for example, be a series of depressions or wells on or in a plate. For example, it can be a spot plate or a corresponding plate which has depressions at regular intervals. In particular, the porous support material can also be present in the form of bodies of any shape, for example in the form of tubes which have been cut open and divided into two halves that can be rejoined for a subsequent catalytic test. Preference is given to porous support materials made of ceramics, metals or activated carbons. Examples of such supports are described in DE-A-198 05 719 as auxiliary supports.

The exact configuration of the planar substrate is not restricted. Preferably, the planar substrate is subdivided into individual defined places which are spatially delimited from one another.

The expression "planar target" denotes a target which extends considerably further in two directions in space than in the third direction in space. The planar target, like the planar substrate, need not necessarily be flat. It can be provided on the surface, at least in part, with planar metal pieces and/or nonmetal pieces of at least one metal or nonmetal different from the target. The pieces can be fixed, for example, by glueing, soldering or welding. The spatial extension can then be chosen during the sputtering. The planar target can be arranged, for example, horizontally and can be coated on the surface at least in part with planar metal pieces and/or nonmetal pieces of at least one metal or nonmetal which is different from the target. In this case the target is sputtered from above.

The planar target is arranged in parallel to the planar substrate. This ensures that on the planar substrate a matrix of different materials is formed during the sputtering, since regions of different material compositions are present on the target. Slight deviations from parallelity of, for example, ±5°, preferably ±2°, can be tolerated in this case.

The target has surface regions of differing composition. In this case, at at least two different spatial positions of the target, different surface compositions are present.

For example, a target can be coated at different positions with foil pieces of different metal foils and/or nonmetal foils, as a result of which, in a simple manner, a planar target is obtained having surface regions of different chemical composition.

Preferably, the target is coated with metal pieces and/or nonmetal pieces which are selected from metals of groups Ib, IIb, IIIb, IVb, Vb, VIb, VIIb and VIII, lanthanides and actinides, and also metals and nonmetals of groups Ia, IIa, IIIa, IVa, Va and VIa of the Periodic Table of the Elements. The sputtering process can be carried out for a large range of metals and nonmetals.

Preferably, from two to twenty, particularly preferably from two to ten, in particular from two to five, different metal pieces and/or nonmetal pieces are present on the target.

For example, the target used can be a noble metal target such as a gold target that is coated in a suitable manner with other noble metal foil pieces such as platinum foil pieces and palladium foil pieces. For example, also, an iron target can be coated in a suitable manner with foil pieces of the elements gold, platinum and nickel. The foil pieces can be arranged on the target by chance or according to defined ordering principles. Preferably, foil pieces of different composition are arranged in such a manner that as many different material compositions as possible result in different regions on the planar substrate (mosaic target). On the planar substrate, not only are the compositions according to the individual foil pieces obtained, but also mixtures of two or more thereof.

The sputtered matrix can also be subdivided into ordered sectors, for example into a two-dimensional matrix, which is coated with the foil pieces according to combinatorial principles.

The sputtering parameters are selected according to the invention in such a manner as to give an (overlapping) distribution of the differing components on the substrate and thus the respective composition of the differing samples.

The resulting layer thickness of sputtered material can vary from a monoatomic layer to about 500 $\mu$m.

The invention also relates to a process for the combinatorial production of a library of materials in the surface region of a planar substrate by sputtering, with a ribbon-shaped substrate being shifted in the longitudinal direction and at least two targets of differing chemical composition used for the sputtering being arranged over the ribbon along the direction of shifting.

In this case it is a continuous process, preferably for coating ribbons by moving the ribbon in one direction with simultaneous coating by different targets by means of sputtering. Instead of a target coated with, for example, foils, a plurality of targets of differing composition are arranged over the transportable ribbon in the direction of the ribbon.

The two or more targets are then excited, preferably, in a phase-shifted manner in such a manner that different materials are deposited on the ribbon-shaped substrate in the direction of the ribbon. This can be achieved, for example, by the current intensity of the individual targets being varied in a phase-shifted manner for the individual components as a function of time with the ribbon running at a constant speed. The resulting ribbon then has different compositions over its entire length and can be tested for useful properties in the individual sections. Suitable ribbon materials are metal ribbons, metal nets, woven metal cloths, knitted metal cloths or felted metal cloths which can be cut into pieces for the testing for useful catalytic properties and then analyzed. They can be processed, for example, to form tubes. The type of the ribbon material is not restricted to metals, but the carrier can, as described above, also be made up of glass, ceramics or activated carbon. Ceramics which can be used are, in particular, oxides, nitrides and carbides as glass ceramics or sintered quartz. Reference may be made in turn to DE-A-198 05 719.

For example, three different targets arranged one behind the other can be excited according to a respectively shifted sawtooth function, so that in each case only two targets act on one position of the substrate and binary mixtures with gradients are obtained.

The invention also relates to a process for the combinatorial testing of libraries of materials which are obtained by one of the abovementioned processes in which individual defined places of the substrate are analyzed for a desired property by physical and/or chemical methods and the composition of the defined places of the substrate for which the desired property was found is then analyzed. The analysis can also be carried out as described in DE-A-198 05 719.

The invention will be described in more detail below with reference to an example:

A round disk-shaped $GeSb_2Te_4$ target having a diameter of 15 cm was coated using Co chips having a diameter of 1 cm at a distance of 5 cm. On the matrix obtained by sputtering, cobalt contents of from 1.8 to 3.6% were measured. It is implied therefrom that due to inhomogeneous arrangement of such metal chip coatings on a target, inhomogeneous coatings on a matrix are also obtained, since the inhomogeneous coating of the target is carried over to the sputtered surface.

We claim:

1. A process for the combinatorial production of a library of materials in the form of a two-dimensional matrix in the surface region of a planar substrate by sputtering, comprising using a sputtering target having a planar surface arranged in parallel to the planar substrate and upon which planar pieces are inhomogeneously arranged to provide the target surface with regions of different chemical composition, the pieces being of material different from that of the target.

2. A process as claimed in claim 1, wherein the sputtering is carried out using high-energy ions or neutral particles.

3. A process as claimed in claim 2, wherein the target is coated with pieces which are selected from metals of groups Ib, IIb, IIIb, IVb, Vb, VIb, VIIb and VIII, lanthanides and actinides, and metals and nonmetals of groups Ia, IIa, IIIa, IVa, Va and VIa of the Periodic Table of the Elements.

4. A process as claimed in claim 2, wherein the planar substrate is subdivided into individual defined places which are spatially delimited from one another.

5. A process as claimed in claim 2, wherein the planar substrate has at least on the surface a porous support material which can be present in the form of shaped bodies.

6. A process as claimed in claim 2, wherein the planar substrate is made up at least on the surface of glass, ceramics, metal and/or activated carbon.

7. A process for the combinatorial testing of libraries of materials which are obtained by a process as claimed in claim 2, in which individual defined places of the substrate are analyzed for a desired property by physical and/or chemical methods and then the composition of the defined places of the substrate for which the desired property was found is analyzed.

8. A process as claimed in claim 1, wherein the target is coated with pieces selected from metals of groups Ib, IIb, IIIb, IVb, Vb, VIb, VIIb and VIII, lanthanides and actinides, and metals and nonmetals of groups Ia, IIa, IIIa, IVa, Va and VIa of the Periodic Table of the Elements.

9. A process as claimed in claim 8, wherein the planar substrate is subdivided into individual defined places which are spatially delimited from one another.

10. A process as claimed in claim 8, wherein the planar substrate has at least on the surface a porous support material which can be present in the form of shaped bodies.

11. A process as claimed in claim 8, wherein the planar substrate is made up at least on the surface of glass, ceramics, metal and/or activated carbon.

12. A process for the combinatorial testing of libraries of materials which are obtained by a process as claimed in claim 8, in which individual defined places of the substrate are analyzed for a desired property by physical and/or chemical methods and then the composition of the defined places of the substrate for which the desired property was found is analyzed.

13. A process as claimed in claim 1, wherein the planar substrate is subdivided into individual defined places which are spatially delimited from one another.

14. A process as claimed in claim 13, wherein the planar substrate has at least on the surface a porous support material which can be present in the form of shaped bodies.

15. A process as claimed in claim 13, wherein the planar substrate is made up at least on the surface of glass, ceramics, metal and/or activated carbon.

16. A process for the combinatorial testing of libraries of materials which are obtained by a process as claimed in claim 13, in which individual defined places of the substrate are analyzed for a desired property by physical and/or chemical methods and then the composition of the defined places of the substrate for which the desired property was found is analyzed.

17. A process as claimed in claim 1 wherein the planar substrate has at least on the surface a porous support material which can be present in the form of shaped bodies.

18. A process as claimed in claim 17, wherein the planar substrate is made up at least on the surface of glass, ceramics, metal and/or activated carbon.

19. A process for the combinatorial testing of libraries of materials which are obtained by a process as claimed in claim 17, in which individual defined places of the substrate are analyzed for a desired property by physical and/or chemical methods and then the composition of the defined places of the substrate for which the desired property was found is analyzed.

20. A process as claimed in claim 1, wherein the planar substrate is made up at least on the surface of glass, ceramics, metal and/or activated carbon.

21. A process for the combinatorial testing of libraries of materials which are obtained by a process as claimed in claim 20, in which individual defined places of the substrate are analyzed for a desired property by physical and/or chemical methods and then the composition of the defined places of the substrate for which the desired property was found is analyzed.

22. A process for the combinatorial testing of libraries of materials which are obtained by a process as claimed in claim 1, in which individual defined places of the substrate are analyzed for a desired property by physical and/or chemical methods and then the composition of the defined places of the substrate for which the desired property was found is analyzed.

23. The process of claim 1 wherein the planar pieces include multiple planar pieces of a material different from that of the target.

24. The process of claim 23, wherein the multiple planar pieces are arranged inhomogeneously on the target surface.

25. A process for the combinatorial production of a library of materials in the surface region of a planar substrate by sputtering, which comprises a ribbon-shaped substrate being shifted in the longitudinal direction and at least two targets of different chemical compositions which are used for the sputtering being arranged over the ribbon along the direction of shifting.

26. A process as claimed in claim 25, wherein the two or more targets are excited in a phase-shifted manner in such a manner that different materials are deposited on the ribbon-shaped substrate in the direction of the ribbon.

27. A process as claimed in claim 26, wherein the planar substrate is made up at least on the surface of glass, ceramics, metal and/or activated carbon.

28. A process for the combinatorial testing of libraries of materials which are obtained by a process as claimed in claim 25, in which individual defined places of the substrate are analyzed for a desired property by physical and/or chemical methods and then the composition of the defined places of the substrate for which the desired property was found is analyzed.

29. A process as claimed in claim 25, wherein the planar substrate is made up at least on the surface of glass, ceramics, metal and/or activated carbon.

30. A process for the combinatorial testing of libraries of materials which are obtained by a process as claimed in claim 25, in which individual defined places of the substrate are analyzed for a desired property by physical and/or chemical methods and then the composition of the defined places of the substrate for which the desired property was found is analyzed.

\* \* \* \* \*

UNITED STATES PATENT AND TRADEMARK OFFICE
CERTIFICATE OF CORRECTION

PATENT NO. : 6,790,322 B2
DATED : September 14, 2004
INVENTOR(S) : Schunk et al.

It is certified that error appears in the above-identified patent and that said Letters Patent is hereby corrected as shown below:

Column 5,
Line 38, should read -- A process for the combinatorial testing of libraries of materials which are obtained by a process as claimed in claim 26 in which individual defined places of the substrate are analyzed for a desired property by physical and/or chemical methods and then the composition of the defined places of the substrate for which the desired property was found is analyzed. --

Signed and Sealed this

First Day of March, 2005

JON W. DUDAS
*Director of the United States Patent and Trademark Office*

UNITED STATES PATENT AND TRADEMARK OFFICE
CERTIFICATE OF CORRECTION

PATENT NO.    : 6,790,322 B2
DATED         : September 14, 2004
INVENTOR(S)   : Schunk et al.

It is certified that error appears in the above-identified patent and that said Letters Patent is hereby corrected as shown below:

<u>Column 6,</u>
Line 38, should read -- A process for the combinatorial testing of libraries of materials which are obtained by a process as claimed in claim 26 in which individual defined places of the substrate are analyzed for a desired property by physical and/or chemical methods and then the composition of the defined places of the substrate for which the desired property was found is analyzed. --

This certificate supersedes Certificate of Correction issued March 1, 2005.

Signed and Sealed this

Twenty-fourth Day of March, 2005

JON W. DUDAS
*Director of the United States Patent and Trademark Office*